United States Patent [19]

Byatt

[11] Patent Number: 5,317,172
[45] Date of Patent: May 31, 1994

[54] PNPN SEMICONDUCTOR DEVICE CAPABLE OF SUPPORTING A HIGH RATE OF CURRENT CHANGE WITH TIME

[75] Inventor: Stephen W. Byatt, Bromham, United Kingdom

[73] Assignee: Texas Instruments Incorporated, Dallas, Tex.

[21] Appl. No.: 896,932

[22] Filed: Jun. 11, 1992

[30] Foreign Application Priority Data

Nov. 27, 1991 [GB] United Kingdom ............... 9125260

[51] Int. Cl.$^5$ .................. H01L 29/080; H01L 29/740
[52] U.S. Cl. .................................. 257/164; 257/173; 257/168; 257/132; 257/152
[58] Field of Search ............... 257/149, 164, 165, 175, 257/126, 128, 139, 142, 110, 152, 163

[56] References Cited

U.S. PATENT DOCUMENTS

| | | | |
|---|---|---|---|
| 3,619,738 | 11/1971 | Otsuka | 317/235 |
| 3,641,403 | 2/1972 | Nakata | 317/235 R |
| 3,688,164 | 8/1972 | Tsukuda et al. | 317/235 |
| 3,918,082 | 11/1975 | Hutson | 257/164 |
| 3,996,601 | 12/1976 | Hutson | 357/39 |
| 4,035,825 | 7/1977 | Kirschner | 257/165 |
| 4,825,270 | 4/1989 | Satou et al. | 257/152 |
| 4,841,350 | 6/1989 | Nishizawa | 257/113 |
| 4,905,119 | 2/1990 | Webb | 361/119 |
| 5,001,537 | 3/1991 | Colman et al. | 257/173 |
| 5,005,065 | 4/1991 | Piccone et al. | 357/38 |
| 5,028,974 | 7/1991 | Kitagawa et al. | 257/149 |

FOREIGN PATENT DOCUMENTS

| | | |
|---|---|---|
| 0116651 | 8/1984 | European Pat. Off. . |
| 0231895 | 8/1987 | European Pat. Off. . |
| 2048159 | 4/1971 | Fed. Rep. of Germany ......... H01L 29/86 |
| 2457106 | 6/1976 | Fed. Rep. of Germany . |
| 2205685 | 12/1988 | United Kingdom ........ H01L 29/90 |

OTHER PUBLICATIONS

IEEE Transactions on Electron Devices, vol. 31, No. 3, Mar. 1984, New York, US, pp. 322-328 Andrei P. Silard et al. "A Double-Interdigitated GTO Switch".
Patent Abstract of Japan, vol. 12, No. 232 (E-628) (3079) Jun. 30, 1988.
Patent Abstract of Japan, vol. 11, No. 265 (E-535) (2712) Aug. 27, 1987.
Patent Abstract of Japan, vol. 11, No. 209 (E-521) (2656) Jul. 7, 1987.

Primary Examiner—Rolf Hille
Assistant Examiner—David B. Hardy
Attorney, Agent, or Firm—Russell E. Baumann; Richard L. Donaldson; Rene' E. Grossman

[57] ABSTRACT

A PNPN semiconductor device has an inner P-type region which includes at least one ridge which extends into its outer N-type region and terminates short of the outer boundary of the outer N-type region, the inner P-type region includes a formation which is substantially level with the outer boundary of the outer N-type region, and the device includes a terminal which contacts the outer N-type region and the formation of the inner P-type region.

An alternative structure of the PNPN semiconductor device has an inner P-type region having at least one elongate sub-region, of higher conductivity than the remainder of the inner P-type region, lying along the junction between the inner P-type region and the outer N-type region, the formation which is substantially level with the outer boundary of the outer N-type region, and the terminal which contacts the formation and the outer N-type region.

19 Claims, 2 Drawing Sheets

PNPN SEMICONDUCTOR DEVICE CAPABLE OF SUPPORTING A HIGH RATE OF CURRENT CHANGE WITH TIME

BACKGROUND OF THE INVENTION

The present invention relates to a PNPN semiconductor device.

PNPN semiconductor devices, also known as thyristors, have three PN junctions in series, those junctions being formed by four regions in series. The regions are an outer P-type region, an inner N-type region, an inner P-type region and an outer N-type region. The devices exhibit bistable characteristics and can be switched between a high-impedance low-current state and a low-impedance high current state.

PNPN semiconductor devices can be two-terminal devices (having connections only to the outer regions), three-terminal devices (having connections to the outer regions and one of the inner regions), or four-terminal devices (having connections to all regions).

PNPN semiconductor devices switch from the high-impedance low-current state to the low-impedance high-current state when a voltage in excess of their breakover or trigger voltage is applied to the terminals connected to their outer regions. The devices remain in the low-impedance high-current state so long as the source of the applied voltage provides a current in excess of their holding current.

The structures and the doping levels of the four regions of PNPN semiconductor devices determine the breakover or trigger voltages and the holding currents of the devices, and any one or more of those regions may include, for example, sub-regions which serve to provide breakover voltages and holding currents specific to the uses of the devices.

SUMMARY OF THE INVENTION

The present invention provides a PNPN semiconductor device including an inner P-type region having at least one elongate sub-region, of higher conductivity than the remainder of the inner P-type region, lying along the junction between the inner P-type region and the outer N-type region, the inner P-type region including a formation which is substantially level with that outer boundary of the outer N-type region which is opposite the junction between the inner P-type region and the outer N-type region, and a terminal on the outer boundary of the outer N-type region contacts the formation belonging to the inner P-type region.

Preferably, the inner P-type region includes a plurality of sub-regions of higher conductivity than the remainder of the inner P-type region, lying along the junction between the inner P-type region and the outer N-type region. The plurality of sub-regions may not intersect one another, or alternatively, the plurality of sub-regions can intersect one another to form a grid.

Preferably, the inner P-type region includes a plurality of groups of the sub-regions, the sub-regions of each group are substantially parallel to one another, and each group of the sub-regions intersects the other group of the sub-regions or the other groups of sub-regions.

The inner P-type region may have two groups of the sub-regions which are substantially orthogonal to each other.

Alternatively, the inner P-type region can have three or six groups of the sub-regions, and each group intersects the other groups of the sub-regions.

Preferably, the sub-regions of each group of the sub-regions have a uniform spacing from one another and, preferably, the sub-regions of all of the groups have the same spacing from one another.

Preferably, the sub-region of each sub-region extends beyond the remainder of the inner P-type region into the outer N-type region and terminates short of that outer boundary of the outer N-type region which is opposite its junction with the inner P-type region.

Preferably, the formation of the inner P-type region which is level with the outer boundary of the outer N-type region is the periphery of the inner P-type region and that periphery extends beyond the sub-regions to that outer boundary of the outer N-type region which is opposite the junction between the inner P-type region and the outer N-type region.

A method of fabricating the outer N-type region and the inner P-type region of the PNPN device includes the steps of diffusing at least one elongate $P^+$-type sub-region through a surface of the P-type region into the P-type region, and diffusing an N-type dopant through the surface to a depth less than that of the P-type region.

The present invention also provides a PNPN semiconductor device in which the inner P-type region include at least one ridge which extends into the outer N-type region and terminates short of the outer boundary of the outer boundary of the outer N-type region a formation which is substantially level with the outer boundary of the outer N-type region, and a terminal which contacts the outer N-type region and the inner P-type region.

Preferably, there are a plurality of the ridges forming a grid. The grid may be rectangular, triangular or hexagonal. The ridges may be, but need not be, evenly spaced from one another.

Advantageously, the outer N-type region is set into the inner P-type region, the inner P-type region has a periphery the surface of which is substantially level with the outer boundary of the outer N-type region, and a contact terminal on the outer boundary of the outer N-type region lies in contact with at least a part of the surface of the periphery of the inner P-type region.

Preferably, the PNPN semiconductor device includes an additional N-type sub-region positioned in the inner N-type region adjacent to the inner P-type region.

A plurality of PNPN semiconductor devices in which the inner P-type region of each device includes a plurality of projections which extend into the outer N-type region and terminate short of the outer boundary of the outer N-type region can be fabricated as a monolithic integrated circuit. Two of the PNPN devices can be fabricated as a monolithic integrated circuit in which the two PNPN devices are connected, in parallel, in opposite senses. One of the PNPN devices and a PN diode can be fabricated as a monolithic integrated circuit in which the PNPN device and the PN diode are connected, in parallel, in opposite senses.

BRIEF DESCRIPTION OF THE DRAWINGS

A PNPN semiconductor device in accordance with the invention will now be described by way of example only with reference to the accompanying drawings, in which.

DETAILED DESCRIPTION OF THE PREFERRED EMBODIMENTS

Figure 1:
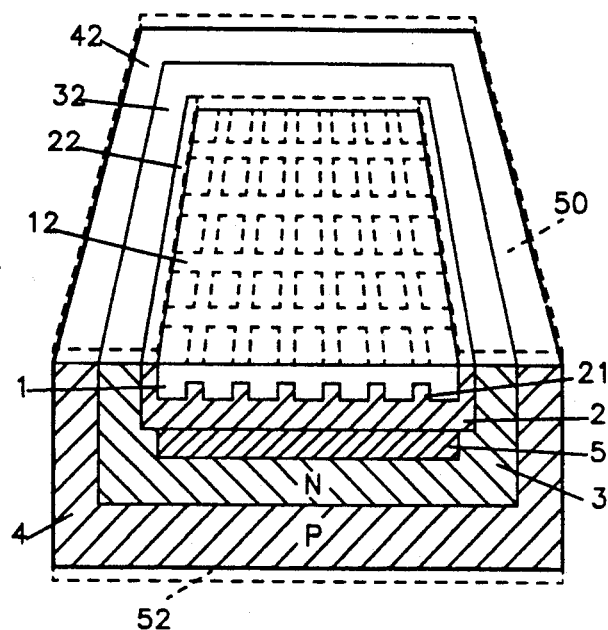
FIG. 1 is a perspective view of the internal structure of the complete device.

Referring to FIG. 1 of the accompanying drawings, the PNPN semiconductor device forms a substantially rectangular block. The outer N-type region 1 is substantially rectangular and is set into the inner P-type region 2 which is itself set into the inner N-type region 3. The inner N-type region 3 is set into the outer P-type region 4 and all the regions have free upper surfaces 12, 22, 32 and 42 (as seen in the figure) which are substantially level with one another. An additional N-type region 5 is set into the inner N-type region 3 within the boundary of the inner P-type region 2 and immediately adjacent to it.

The inner P-type 2 region includes a plurality of P+-type sub-regions in the form of ridges 21 which extend into the outer N-type region 1 but do not penetrate as far as the upper surface 12 of the outer N-type region 1. Some of the P+-type ridges 21 extending along the inner P-type region 2 with the remainder extending across it to form uniform rectangular grid.

Figure 2:
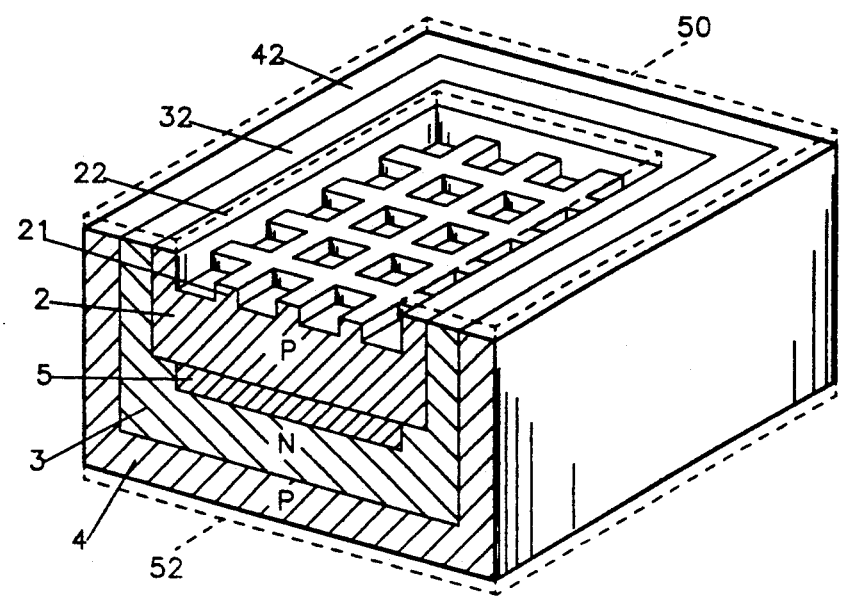
FIG. 2 is a perspective view of the internal structure of the device with one region omitted.

FIG. 2 shows the device with the outer N-type region 1 omitted and the grid formed by the P+-type ridges 21 can be seen fully. The P+-type ridges 21 are extensions of the inner P-type region 2 and act as parts of the inner P-type region 2.

Referring to FIG. 1, the inner P-type region 2 of the PNPN semiconductor device acts as the base region of an NPN transistor consisting of the regions 1, 2 and 3. When a voltage is applied to the device, in a sense that makes the region 4 positive with respect to the region 1, current flow is blocked by the junction between the regions 2 and 3 unless the applied voltages exceed the breakdown voltage of that junction. When the applied voltage causes breakdown of the junction between the regions 2 and 3, charge carriers are injected from the region 3 and the region 1 into the region 2. Because the region 2 acts as the base region of the NPN transistor consisting of the regions 1, 2 and 3, the injection of charge carriers into the region 2 causes the regions 1, 2 and 3 to become conductive and the blocking effect of the junction between the regions 2 and 3 to diminish. The device switches to a conducting state and remains in the conducting state so long as the source of the applied voltage maintains the current above the holding current.

The holding current for the device is controlled by the current gain of the NPN transistor consisting of the regions 1, 2 and 3 and that current gain is controlled by the structure of the region 2, which is the base region of the NPN transistor. The inclusion of the P+-type ridges 21 reduces the current gain of the NPN transistor consisting of the regions 1, 2 and 3 compared to the gain of the transistor without the ridges 21. That reduction in current gain occurs because the P+-type ridges 21 absorb some of the charge carriers injected from the region 1. Those charge carriers must cross the region 1 in order to influence the current gain of the NPN transistor and, because they have a specific lifetime, the fact that they must travel through the P+-type ridges 21 and the region 2 reduces the number of charge carriers that reach their destination. The current gain of the NPN transistor is reduced by the increased conductivity of the P+-type ridges 21 because their increased conductivity makes available more charges for neutralizing those injected from the region 1 and the fact that they are ridges increase the distance which the injected charges must travel.

The P+-type ridges 21 assume substantially the same potential as the region 2 which serves as the base region of the NPN transistor, the region 2 serving as the emitter region of the NPN transistor. When a zone of the base-emitter region becomes conductive, the adjacent P+-type ridges assume the potential of the region 2 that is conductive and spread that potential, encouraging the spread of the conductive zone. The action of the P+-type ridges 21 in equalizing the potential levels in the region 2, as current flow starts between the regions 1 and 2, serves to spread the current flow evenly through those regions. The P+-type ridges 21 serve to produce a smooth rise in the current flow through the device. The current flowing through the device is evenly distributed with the result that the device is capable of supporting a higher rate of change of current than know devices.

Known devices employ shorting dots rather than ridges for increasing the holding current. Shorting dots are isolated projections of the region 2 through the region 1. Shorting dots assume the potential of the emitter region 1 and effects in their vicinity required for transistor gain are negated. When, in a device with shorting dots, a zone of the base-emitter region becomes conductive the conductive zone tends to be isolated by the immediately adjacent shorting dots from the remainder of the base-emitter region. Current flow from a conductive zone spreads to an adjacent zone only when the current level reaches a critical level. When an adjacent zone becomes conductive, the current density falls to below the critical level and the turn-on of further zones is delayed until the current in each conductive zone reaches the critical level. The overall effect is that the shorting dots delay the turn-on of the device and cause the current to rise in jumps.

In a device with P+-type ridges, the tendency for current to concentrate in a zone in the region 2 is reduced or overcome by the P+-type ridges, which is not the case in known devices, for example, devices with shorting dots. A device with P+-type ridges has even current flow throughout it and is capable of supporting a higher rate of change of current with time than devices which do not include P+-type ridges or equivalent formations.

Formations equivalent to the rectangular array of P+-type ridges 21 are a hexagonal or triangular array of P+-type ridges. The ridges need not be spaced regularly and none of the arrays needs to be regular. An alternative structure is a P+-type grid which is buried in the P+-type region 2.

In the fabrication of the device shown in FIGS. 1 and 2, the outer N-type region 1 and the inner P-type region 2 are fabricated by first diffusing a P-type region, diffusing a P+-type grid structure through the surface of the P-type region, and diffusing an N-type impurity through the surface of the P-type region to overdope the P-type region for a part of its depth. Those diffusion steps result in the part of the P-type region which is not overdoped remaining as the inner P-type region 2 and the overdoped upper part of the P-type region becoming the N-type outer region 1. The P+-type grid which first extended to the surface of the P-type region is reduced in height by the N-type dopant. The N-type dopant overdopes the P-type region at a higher rate than it overdopes the P+-type grid and the result is that the P+-type grid extends from the remainder of the P-type inner region 2 as shown in FIGS. 1 and 2. The P+-type grid could be implanted and the N-type overdoping stopped when it reaches the P+-type grid, in which case the P+-type grid would not extend from the remainder of the P-type region 2, providing the alternative structure with a buried P+-type grid.

In an alternative method, providing another alternative structure, the outer N-type region 1 and the inner P-type region 2 is fabricated by first diffusing a P-type region, diffusing a plurality of N-type sub-regions through the surface of the P-type region to leave P-type grid extending to the surface, and an N-type impurity diffused through the whole surface to provide a P-type grid which does not extend to the surface of the N-type outer region. In the alternative structure, the grid is P-type rather than P+-type material and the alternative device has a lower holding current than the device with the P+-type grid, because the P-type material absorbs fewer mobile charges than does P+-type material.

The PNPN semiconductor device shown in FIGS. 1 and 2 is a bulk breakdown diode. In that device, an additional N-type sub-region, the region 5, which is of higher conductivity than the region 3, is positioned in the region 3, adjacent to the region 2, and sets the breakdown voltage for the junction between the regions 2 and 3.

Referring to FIG. 1, a complete device requires the provision of a first terminal 50 connected to the upper surface of the outer N-type region 1 and a second terminal 52 connected to the lower surface of the outer P-type region 4. The first terminal contacts at least a part of the exposed part of the inner P-type region 2. A consequence of the first terminal contacting both the regions 1 and 2 is that some current passes from the region 2 to the first terminal without flowing through the region 1, reducing the effective current gain of the NPN transistor consisting of the regions 1, 2 and 3. The reduction in the current gain of the NPN transistor contributes to an increase in the holding current of the device.

The rectangular array of ridges, or the equivalent formations or structures described above, may be used in PNPN semiconductor devices other than bulk breakdown diodes for setting the device holding current. For example, the rectangular array of ridges 21 or the equivalent formations or structures may be used in three-terminal thyristors for setting the device holding current.

Figure 3:
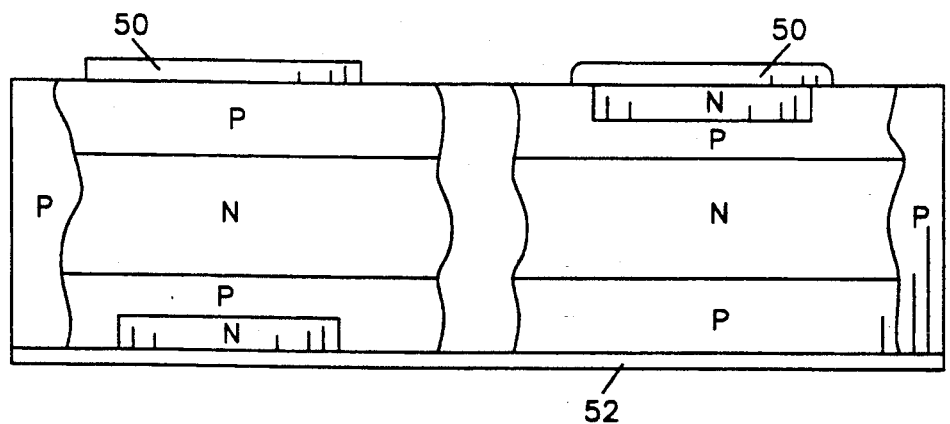
FIG. 3 shows a diagrammatical view of two devices of FIG. 1 fabricated as a monolithic integrated circuit in opposite orientation to form a bidirectional device.
Figure 4:
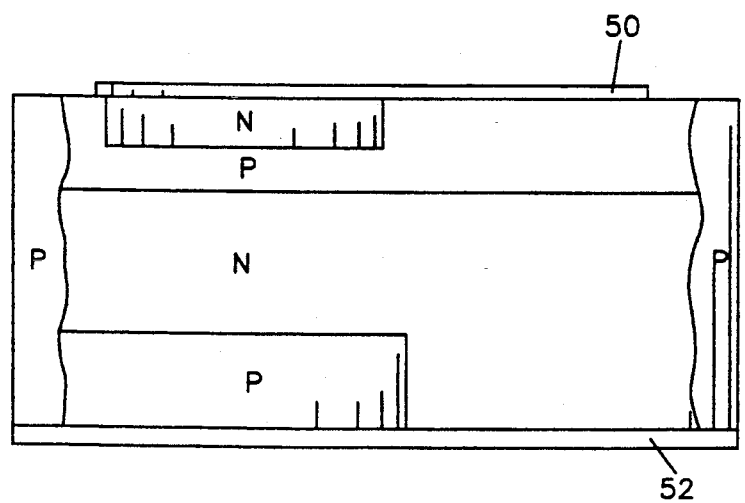
FIG. 4 shows a diagrammatical view of the device of FIG. 1 fabricated together with a PN diode on a monolithic integrated circuit.

A plurality of PNPN semiconductor devices having the structure shown in FIGS. 1 and 2 can be fabricated as a monolithic integrated circuit as shown diagrammatically in FIG. 3 without showing the details of the grid. Two of the PNPN devices fabricated as a monolithic integrated circuit may be connected, in parallel, in opposite senses to form a bidirectional device, the regions 2, 3 and 4 being extended beyond the region 1 and being shared by the two devices. Alternatively, one of the PNPN devices having the structure shown in FIGS. 1 and 2 can be fabricated together with a PN diode as a monolithic integrated circuit as shown diagrammatically as FIG. 4 without showing the details of the grid in which the regions 2 and 3 extend beyond the region 1 and the extended parts of the regions 2 and 3 form the PN diode.

I claim:

1. A PNPN semiconductor device comprising an outer P-type region having an outer surface boundary for the PNPN semiconductor device, an inner N-type region, an inner P-type region and an outer N-type region having an outer surface boundary for the PNPN semiconductor device with a first junction between the outer N-type region and the inner P-type region, a second junction between the inner P-type region and the inner N-type region and a third junction between the inner N-type region and the outer P-type region; said inner P-type region including an outer formation around the periphery of the inner P-type region surrounding the inner P-type region on all sides extending from the inner P-type region to be substantially level with the outer surface boundary of the outer N-type region and within said outer formation at least a portion of higher conductivity than the remainder of the inner P-type region extending from the remainder of the inner P-type region and terminating short of the outer surface boundary of the outer N-type region whereby said portion of the inner P-type region forms part of said first junction; and a first terminal on the outer surface boundary of the outer N-type region contacting the formation of the inner P-type region and a second terminal on the outer surface boundary of the outer P-type region.

2. A PNPN semiconductor device as claimed in claim 1 wherein the inner P-type region includes a plurality of portions of higher conductivity than the remainder of the inner P-type region lying along the junction between the inner P-type region and the outer N-type region, and the portions do not intersect one another.

3. A PNPN semiconductor device as claimed in claim 1 wherein the inner P-type region includes a plurality of portions of higher conductivity than the remainder of the inner P-type region lying along the junction between the inner P-type region and the outer N-type region, and the portions intersect one another to form a grid.

4. A PNPN semiconductor device as claimed in claim 3 wherein the inner P-type region includes a plurality of groups of the portions, the portions of each group are substantially parallel to one another, and each group of portions intersects the other group of portions.

5. A PNPN semiconductor device as claimed in claim 4 wherein the inner P-type region has two groups of the portions in which one group of portions are substantially orthogonal to the other group of portions.

6. A PNPN semiconductor device as claimed in claim 3 wherein the inner P-type region has three groups of portions and each group of portions intersects the other groups of the portions.

7. A PNPN semiconductor device as claimed in claim 3 wherein the inner P-type region has six groups of portions and each group of portions intersects the other groups of the portions.

8. A PNPN semiconductor device as claimed in claim 4 wherein the portions of each group of the portions have a uniform spacing one from another.

9. A PNPN semiconductor device as claimed in claim 8 wherein the portions of all of the groups of portions have the same spacing one from another.

10. A PNPN semiconductor device as claimed in claim 1 which includes a N-type portion of higher conductivity positioned in the inner N-type region adjacent to the inner P-type region.

11. A compound PNPN device including a plurality of PNPN devices as claimed in claim 1, fabricated as a monolithic integrated circuit.

12. A compound PNPN device including two PNPN devices as claimed in claim 1, fabricated as a monolithic integrated circuit in which the two PNPN devices are connected in parallel electrical relationship to each other with opposite polarity.

13. A compound PNPN device including a PNPN device as claimed in claim 1, and a PN diode, the compound PNPN device fabricated as a monolithic integrated circuit in which the PNPN device and the PN diode are connected in parallel electrical relationship to each other with opposite polarity.

14. A PNPN semiconductor device comprising an outer P-type region having an outer surface boundary for the PNPN semiconductor device, an inner N-type region, an inner P-type region and an outer N-type region having an outer surface boundary for the PNPN semiconductor device with a first junction between the outer N-type region and the inner P-type region, a second junction between the inner P-type region and the inner N-type region and a third junction between the inner N-type region and the outer P-type region; said inner P-type region including an outer formation around the periphery of the inner P-type material surrounding the inner P-type region on all sides extending from the inner P-type region to be substantially level with the outer surface boundary of the outer N-type region and within said outer formation at least one ridge of higher conductivity than the remainder of the inner P-type region extending from the remainder of the inner P-type region and terminating short of the outer surface boundary of the outer N-type region whereby said portion of the inner P-type region forms part of said first junction; and a first terminal on the outer surface boundary of the outer N-type region contacting the formation of the inner P-type region and a second terminal on the outer surface boundary of the outer P-type region.

15. A PNPN semiconductor device as claimed in claim 14, in which the at least one ridge is a plurality of the ridges.

16. A PNPN semiconductor device as claimed in claim 15, in which the ridges form a grid.

17. A PNPN semiconductor device as claimed in claim 16, in which the ridges of the grid are orthogonal to one another.

18. A PNPN semiconductor device as claimed in claim 15, in which the ridges are uniformly spaced from one another.

19. A PNPN semiconductor device as claimed in claim 16, in which the outer N-type region is set into the inner P-type region.

* * * * *